United States Patent
Du

(10) Patent No.: US 11,200,823 B1
(45) Date of Patent: Dec. 14, 2021

(54) MICROARRAY ADSORPTION SUBSTRATE, DRIVING CIRCUIT, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Yanying Du, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/968,599

(22) PCT Filed: Jul. 2, 2020

(86) PCT No.: PCT/CN2020/099944
§ 371 (c)(1),
(2) Date: Aug. 9, 2020

(30) Foreign Application Priority Data

Jun. 11, 2020 (CN) .......................... 202010530718.7

(51) Int. Cl.
*G09G 3/00* (2006.01)
*H01L 27/12* (2006.01)
*H03K 17/687* (2006.01)

(52) U.S. Cl.
CPC ......... *G09G 3/035* (2020.08); *H01L 27/1255* (2013.01); *H03K 17/6871* (2013.01); *G09G 2300/0842* (2013.01); *G09G 2380/02* (2013.01)

(58) Field of Classification Search
CPC ......... B32B 27/06; B32B 27/28; B32B 33/00; B32B 7/025; B32B 7/06; H01L 27/12; H01L 27/32
See application file for complete search history.

(56) References Cited

U.S. PATENT DOCUMENTS

| | | | |
|---|---|---|---|
| 2002/0123155 A1* | 9/2002 | Himmelhaus .... | G01N 33/54313 436/178 |
| 2003/0164295 A1* | 9/2003 | Sterling ............ | B01L 3/502792 204/450 |
| 2005/0242997 A1* | 11/2005 | Dunn ...................... | H05K 1/162 343/700 MS |
| 2010/0229390 A1* | 9/2010 | Sakashita ................ | B41J 2/1628 29/890.1 |
| 2014/0285234 A1* | 9/2014 | Kozuma ............ | H03K 19/0013 326/38 |
| 2016/0282977 A1* | 9/2016 | Moua ................... | G06K 9/0002 |

* cited by examiner

*Primary Examiner* — Shaheda A Abdin
(74) *Attorney, Agent, or Firm* — The Roy Gross Law Firm, LLC; Roy Gross

(57) ABSTRACT

The present disclosure provides a microarray adsorption substrate, a driving circuit, and a display device. A temporary base is adsorbed on a temporary substrate by charging an electrostatic adsorption microarray structure on the temporary base. After the processing is completed, the temporary base is stripped off from the temporary substrate by discharging the electrostatic adsorption microarray structure, thereby greatly reducing the damage to the temporary base during stripping.

13 Claims, 2 Drawing Sheets

MICROARRAY ADSORPTION SUBSTRATE, DRIVING CIRCUIT, AND DISPLAY DEVICE

The present disclosure relates to the technical field of displays, and in particular to a microarray adsorption substrate, a driving circuit, and a display device.

BACKGROUND OF DISCLOSURE

With the promising development of modern semiconductors and display techniques, a microarray adsorption substrate has been widely used in the technical field of the semiconductors, displays, etc. A flexible display panel, battery, circuit board, etc. currently become the most attractive hot products in the development and present market. Because the roll-to-roll processing technique for microarray adsorption substrates is unmatured, the method of temporary bonding is employed in the processing of integrated circuits and other devices based on various temporary bases. The processing of a flexible organic light-emitting diode (OLED) is taken as an example. A temporary base polyimide film is firstly formed on a glass substrate by amorphous silicon, wherein the amorphous silicon is used as a temporary bonding film. After the processing of an array and a device is completed, the amorphous silicon is dissociated by laser irradiation on the glass substrate, so that the polyimide film is stripped off.

In terms of the damage to the substrate, this is a relatively acceptable processing method. However, the cost of laser stripping is high, and the recycling of the temporary substrate is difficult. Moreover, a scanning impact is formed on the temporary base by a stripping method of the hydrogen splitting of amorphous silicon under a laser. Thus, the microarray adsorption substrate has a serious deformation and is in an uneven state after stripped, which brings new challenges and troubles to the subsequent processes.

Therefore, it is an urgent technical problem for those skilled in the art to provide a microarray adsorption substrate that is not susceptible to damage.

SUMMARY OF INVENTION

Technical Problems

An embodiment of the present disclosure provides a microarray adsorption substrate, a driving circuit, and a display device, so that the technical problem of the damage to the microarray adsorption substrate during stripping is reduced.

Technical Solutions

The present disclosure provides a microarray adsorption substrate.

The microarray adsorption substrate includes a temporary base having a first surface and a second surface disposed opposite each other; an electrostatic adsorption microarray structure disposed on the first surface, wherein the electrostatic adsorption microarray structure is used to charge and discharge; and a protective film is disposed on a surface of the electrostatic adsorption microarray structure away from the temporary base, and embedded in a plurality of gaps of the electrostatic adsorption micro array structure.

In some embodiments, the electrostatic adsorption microarray structure includes at least a set of a latch circuit and a capacitance circuit connected in series with the latch circuit, and the latch circuit is used to charge the capacitance circuit.

In some embodiments, the protective film is a polyimide film.

In some embodiments, a thickness of the polyimide film is 10-1000 microns.

In some embodiments, a width of each line of the capacitance circuit is 10-1000 microns.

In some embodiments, the protective film is selected from any one of alumina film layers, silicon nitride, hafnium oxide, quartz, and polytetrafluoroethylene.

An embodiment of the present disclosure provides a driving circuit which is applied in the microarray adsorption substrate stated above. The microarray adsorption substrate includes a temporary base, an electrostatic adsorption microarray structure, and a protective film. The temporary base has a first surface and a second surface disposed opposite each other. An electrostatic adsorption microarray structure is disposed on the first surface and used to charge and discharge. The protective film is disposed on a surface of the electrostatic adsorption microarray structure away from the temporary base, and embedded in a plurality of gaps of the electrostatic adsorption microarray structure. The driving circuit includes: a power supply including a first end and a second end, wherein the first end has a first interface and a second interface, and the first interface connects a first field-effect transistor. The first field-effect transistor connects a second field-effect transistor and a third field-effect transistor respectively. The first field-effect transistor, the second field-effect transistor, and the third field-effect transistor connect the second end. The second interface connects a sixth field-effect transistor, and the sixth field-effect transistor connects a fifth field-effect transistor and a fourth field-effect transistor respectively. A capacitance is connected between the third field-effect transistor and the fourth field-effect transistor. The fourth field-effect transistor, the fifth field-effect transistor, and the sixth field-effect transistor connect the second end. The first end connects a first switch and a fourth switch, and the second end connects a second switch and a third switch.

In some embodiments, when charging the driving circuit, the first switch connects the first field-effect transistor, the second field-effect transistor, and the third field-effect transistor. The third switch connects the fourth field-effect transistor, the fifth field-effect transistor, and the sixth field-effect transistor. When discharging the driving circuit, the second switch connects the first field-effect transistor, the second field-effect transistor, and the third field-effect transistor. The third switch connects the fourth field-effect transistor, the fifth field-effect transistor, and the sixth field-effect transistor.

In some embodiments, the first end is at a positive potential and the second end is at a negative potential.

In some embodiments, the electrostatic adsorption microarray structure includes at least a set of a latch circuit and a capacitance circuit connected in series with the latch circuit, and the latch circuit is used to charge the capacitance circuit.

In some embodiments, the protective film is a polyimide film.

The present disclosure further provides a display device. The display device includes a microarray adsorption substrate which is described above. A metal layer is disposed on the microarray adsorption substrate. The metal layer includes a semiconductor layer. A plurality of heavily doped regions are disposed on both sides of the semiconductor layer, a gate dielectric layer is disposed on the semiconductor layer, and a gate metal layer is disposed on the gate dielectric layer. The semiconductor layer is in contact with a source-drain metal layer. The microarray adsorption substrate includes a temporary base, an electrostatic adsorption microarray structure, and a protective film. The temporary base has a first surface and a second surface disposed opposite each other. The electrostatic adsorption microarray structure is disposed on the first surface, and used to charge and discharge. The protective film is disposed on a surface of the electrostatic adsorption microarray structure away from the temporary base, and embedded in a plurality of gaps of the electrostatic adsorption microarray structure.

In some embodiments, the electrostatic adsorption microarray structure includes at least a set of a latch circuit and a capacitance circuit connected in series with the latch circuit, and the latch circuit is used to charge the capacitance circuit.

In some embodiments, the protective film is a polyimide film.

In some embodiments, a thickness of the polyimide film is 10-1000 microns.

In some embodiments, a width of each line of the capacitance circuit is 10-1000 microns.

In some embodiments, the protective film is selected from any one of alumina film layers, silicon nitride, hafnium oxide, quartz, and polytetrafluoroethylene.

In some embodiments, the display device further includes a driving circuit. The driving circuit includes: a power supply including a first end and a second end, wherein the first end has a first interface and a second interface, the first interface connects a first field-effect transistor, and the first field-effect transistor connects a second field-effect transistor and a third field-effect transistor respectively. The first field-effect transistor, the second field-effect transistor, and the third field-effect transistor connect the second end. The second interface connects a sixth field-effect transistor, and the sixth field-effect transistor connects a fifth field-effect transistor and a fourth field-effect transistor respectively. A capacitance is connected between the third field-effect transistor and the fourth field-effect transistor, and the fourth field-effect transistor, the fifth field-effect transistor, and the sixth field-effect transistor connect the second end. The first end connects a first switch and a fourth switch, and the second end connects a second switch and a third switch.

In some embodiments, when charging the display device, the first switch connects the first field-effect transistor, the second field-effect transistor, and the third field-effect transistor. The third switch connects the fourth field-effect transistor, the fifth field-effect transistor, and the sixth field-effect transistor. When discharging the display device, the second switch connects the first field-effect transistor, the second field-effect transistor, and the third field-effect transistor. The third switch connects the fourth field-effect transistor, the fifth field-effect transistor, and the sixth field-effect transistor.

In some embodiments, the first end is at a positive potential and the second end is at a negative potential.

Beneficial Effects

The embodiment of the present disclosure provides the microarray adsorption array, the driving circuit, and the display device. The microarray adsorption substrate includes a temporary base, an electrostatic adsorption microarray structure, and a protective film. The temporary base has a first surface and a second surface disposed opposite each other. The electrostatic adsorption microarray structure is disposed on the first surface, and used to charge and discharge. The protective film is disposed on a surface of the electrostatic adsorption microarray structure away from the temporary base, and embedded in a plurality of gaps of the electrostatic adsorption microarray structure. The temporary base is adsorbed on the temporary substrate by charging the electrostatic adsorption microarray structure on the temporary base. After the processing is completed, the temporary base is stripped off from the temporary substrate by discharging the electrostatic adsorption microarray structure, thereby greatly reducing the damage to the temporary base during stripping.

BRIEF DESCRIPTION OF DRAWINGS

In order to clearly illustrate the technical solutions in the embodiments of the present disclosure, the drawings used in the description of the embodiments will be briefly introduced below. Obviously, the drawings in the following description are only some embodiments of the disclosure. Other drawings can also be obtained from those skilled in the art based on these drawings without paying any inventive effort.

DETAILED DESCRIPTION OF EMBODIMENTS

The technical solutions in the embodiments of the present disclosure are clearly and completely described in the following description, which is combined with the drawings in the embodiments of the present disclosure. Obviously, the described embodiments are only a part of the embodiments of the present disclosure, not all embodiments. Based on the embodiments in the present disclosure, other embodiments obtained by those skilled in the art without paying any inventive effort are within the scope of the present disclosure.

It is realized that the direction and position relationship indicated by the terms, such as [upper], [lower], [front], [post], [left], [right], [inside], [outside], are direction and position relationship based on the drawings of this disclosure. The terms only facilitate describing the present disclosure and simplifying the description, not indicate or imply that the devices or elements must have a specific direction, be configured, and operated in a specific direction. Therefore, the terms should not be realized to limit the present invention.

An embodiment of the present disclosure provides a microarray adsorption substrate, a driving circuit, and a display device. A display panel is described in detail below.

Figure 1:
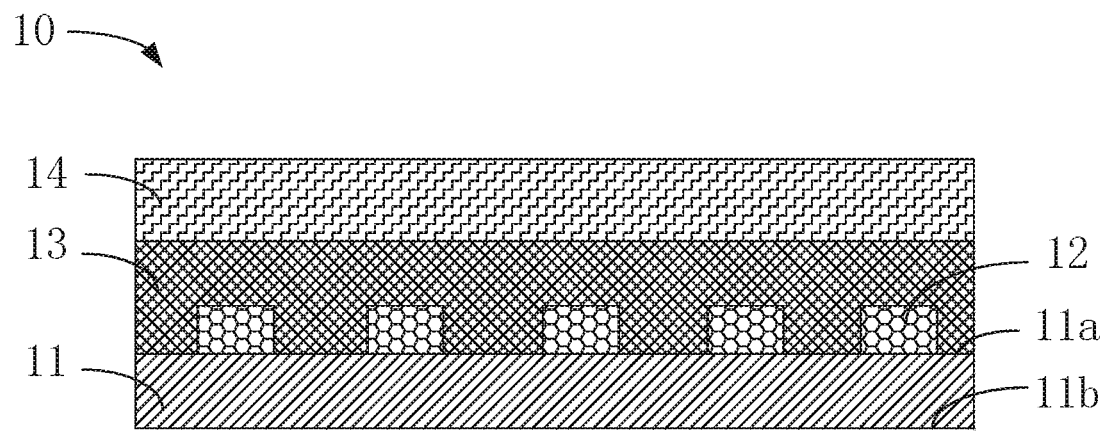
FIG. 1 is a schematic view of a structure of a microarray adsorption substrate of an embodiment of the present disclosure.

Please refer to FIG. 1, which is a schematic view of a structure of a microarray adsorption substrate of an embodiment of the present disclosure. The microarray adsorption substrate includes a temporary base 11, an electrostatic adsorption microarray structure 12, and a protective film 13. The temporary base 11 has a first surface 11a and a second surface 11b disposed opposite each other. The electrostatic adsorption microarray structure 12 is disposed on the first surface 11a and used to charge and discharge. The protective film 13 is disposed on a surface of the electrostatic adsorption microarray structure 12 away from the temporary base 11, and embedded in a plurality of gaps of the electrostatic adsorption microarray structure 12.

It is noted that the first surface 11a may be an upper surface of the temporary base 11, and the second surface 11b may be a lower surface of the temporary base 11. Accordingly, the first surface 11a may be the lower surface of the temporary base 11, and the second surface 11b may be the upper surface of the temporary base 11. In the case of no special description in the embodiments of the present disclosure, the first surface 11a is the upper surface of the temporary base 11 by default, and the second surface 11b is the lower surface of the temporary base 11.

The temporary base 11 may be a bendable base. The additional electrostatic adsorption microarray structure 12 is formed on the temporary base 11 in an array. Accordingly, in some embodiments, the electrostatic adsorption microarray structure 12 may also be disposed on a flexible base 14. The specific arrays of the electrostatic adsorption microarray structure 12 are not redundantly described in the present disclosure.

The protective film 13 is not only used as a dielectric layer which makes the temporary base 11 effectively adsorb the to-be-absorbed flexible base 14, but also used to protect the electrostatic adsorption microarray structure 12 from damage.

The electrostatic adsorption microarray structure 12 includes at least a set of a latch circuit and a capacitance circuit connected in series with the latch circuit, wherein the latch circuit is used to charge the capacitance circuit.

It is understood that when the latch circuit charges the capacitance circuit, the latch circuit locks and stores the capacitance, and adsorbs the temporary base 11 with the temporary substrate by the coulomb force of induced charge. When the manufacturing process is completed, the capacitance discharges, and the temporary base 11 and the temporary substrate are loose, so that the microarray adsorption substrate 10 and the temporary substrate is prevented from damage when separating.

The protective film 13 is a polyimide film. It is understood that abnormalities such as wrinkling easily occur due to the unmatched coefficient of thermal expansion of the polyimide film and the temporary substrate. The polyimide film on the temporary base serves as a capacitance electrode protective film 13 by a film-forming process. That is, the dielectric film may have effective functions of transition and buffering, so that problems caused by the process of fixing the to-be-adsorbed film via the electrostatic adsorption is avoided, such as wrinkling.

A thickness of the polyimide film ranges from 10 to 1000 microns. It is understood that the thickness of the polyimide film may be 10 microns, 100 microns, 200 microns, 500 microns, and 1000 microns. The polyimide film in this scope of the thickness may be reused.

A width of each line of the capacitance circuit is 10-1000 microns. It is understood that the width of each line of the capacitance circuit 28 may be 10 microns, 100 microns, 200 microns, 500 microns, and 1000 microns. The lines of the capacitance circuit within this scope of the width may be reused.

The protective film 13 is any one of alumina film layers, silicon nitride, hafnium oxide, quartz, polytetrafluoroethylene, etc. Additionally, it is noted that a dielectric constant of the alumina film layers is better than dielectric constants of other materials. Therefore, applying the alumina film layers as the protective film 13 may provide effective adsorption.

The microarray adsorption substrate 10 in an embodiment of the present disclosure includes a temporary base 11, an electrostatic adsorption microarray structure 12, and a protective film 13. The temporary base 11 has a first surface and a second surface disposed opposite each other. The electrostatic adsorption microarray structure 12 is disposed on the first surface and used to charge and discharge. The protective film 13 is disposed on a surface of the electrostatic adsorption microarray structure 12 away from the temporary base 11, and embedded in a plurality of gaps of the electrostatic adsorption microarray structure 12. The temporary base 11 is adsorbed on a flexible base 14 by charging the electrostatic adsorption microarray structure 12 on the temporary base 11. After the processing is completed, the temporary base 11 is stripped off from the temporary substrate 4 by discharging the electrostatic adsorption microarray structure 12, thereby greatly reducing the damage to the temporary base 11 when stripping.

Figure 2:
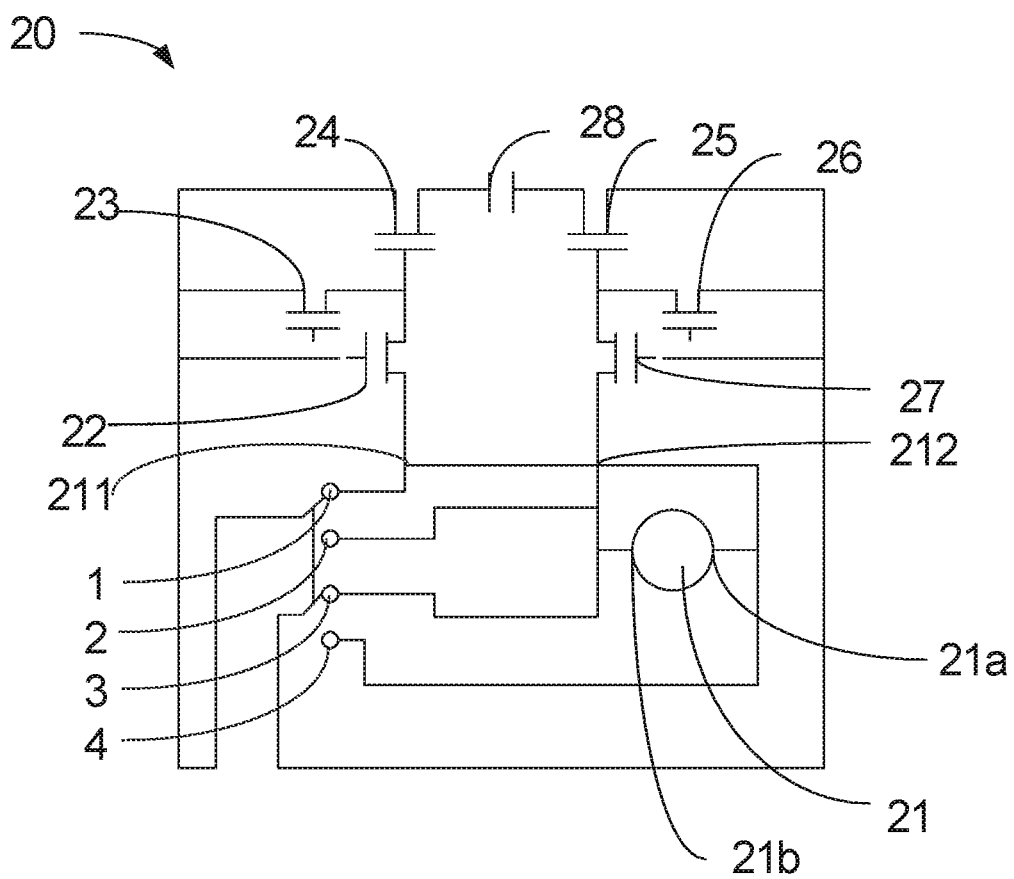
FIG. 2 is a circuit diagram of a driving circuit of an embodiment of the present disclosure.

Please refer to FIG. 2, which is a circuit diagram of a driving circuit provided by an embodiment of the present disclosure. The embodiment of the present disclosure provides a driving circuit 20 applied in the microarray adsorption substrate 10 stated above. The driving circuit 20 includes a power supply 21 including a first end 21a and a second end 21b, wherein the first end 21a has a first interface 211 and a second interface 212. The first interface 211 connects a first field-effect transistor 22, and the first field-effect transistor 22 connects a second field-effect transistor 23 and a third field-effect transistor 24 respectively. The first field-effect transistor 22, the second field-effect transistor 23, and the third field-effect transistor 24 connect the second end 21b. The second interface 212 connects a sixth field-effect transistor 27, and the sixth field-effect transistor 27 connects a fifth field-effect transistor 26 and a fourth field-effect transistor 25 respectively. A capacitance 28 is connected between the third field-effect transistor 24 and the fourth field-effect transistor 25. The fourth field-effect transistor 25, the fifth field-effect transistor 26, and the sixth field-effect transistor 27 connect the second end 21b. The first end 21a connects a first switch 1 and a fourth switch 4, and the second end 21b connects a second switch 2 and a third switch 3.

It is noted that the position of the power supply 21 of the present disclosure may be changed based on the actual need. In fact, the power supply 21 may be replaced by applying a positive electric field and a negative electric field. The setting way of the power supply 21 of the present disclosure is just exemplary description of the embodiments of the present disclosure.

The microarray adsorption substrate 10 is described in detail in the embodiments stated above. Therefore, the microarray adsorption substrate 10 is not redundantly described in the embodiment of the present disclosure.

The first end 21a is at a positive potential, and the second end 21b is at a negative potential. When the driving circuit is being charged, the first switch 1 connects the first field-effect transistor 22, the second field-effect transistor 23, and the third field-effect transistor 24. The third switch 3 connects the fourth field-effect transistor 25, the fifth field-effect transistor 26, and the sixth field-effect transistor. When discharging the driving circuit, the second switch 2 connects the first field-effect transistor 22, the second field-effect transistor 23, and the third field-effect transistor 24. The third switch 4 connects the fourth field-effect transistor 25, the fifth field-effect transistor 26, and the sixth field-effect transistor.

It is noted that the position of the power supply 21 of the present disclosure may be changed based on the actual need. In fact, the power supply 21 may be replaced by applying a positive electric field and a negative electric field. The setting way of the power supply 21 of the present disclosure is just exemplary description of the embodiments of the present disclosure.

The electrostatic adsorption microarray structure 12 is charged by the circuit structure stated above, so that the temporary base 11 is adsorbed on the temporary substrate. After the processing is completed, the temporary base 11 is stripped off from the temporary substrate 4 by discharging the electrostatic adsorption microarray structure 12, thereby greatly reducing the damage to the temporary base 11 when stripping.

Figure 3:
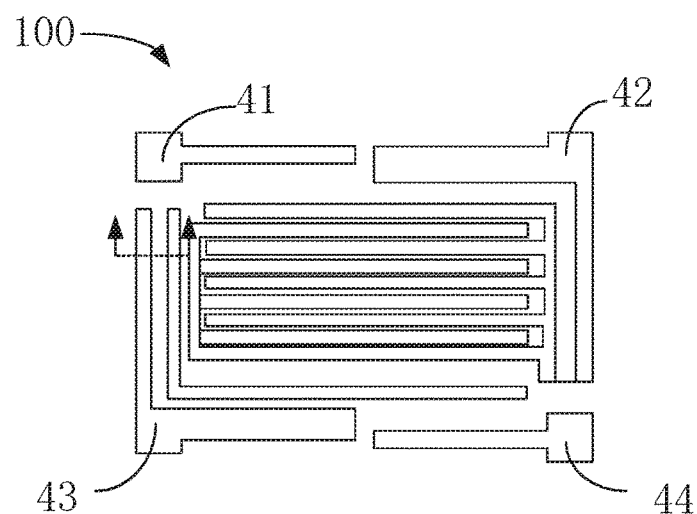
FIG. 3 is a schematic view of a structure of a display device of an embodiment of the present disclosure.
Figure 4:
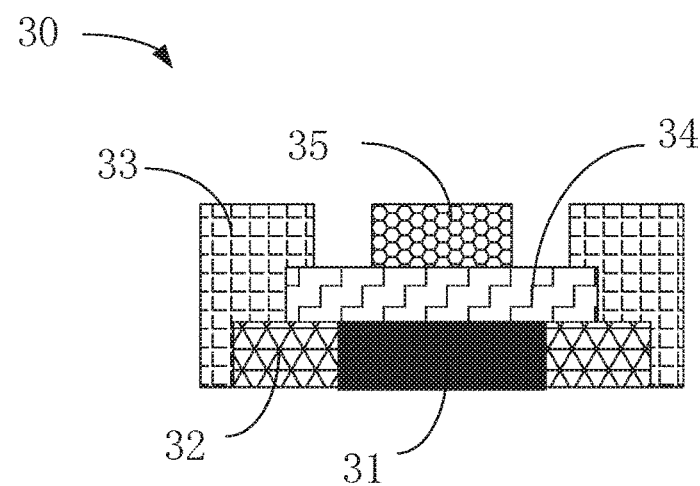
FIG. 4 is a sectional schematic view of the display device of an embodiment of the present disclosure.

Please refer to FIG. 3 and FIG. 4. FIG. 3 is a schematic view of a structure of a display device of an embodiment of the present disclosure. FIG. 4 is a sectional schematic view of the display device of the embodiment of the present disclosure. The display device 100 includes a microarray adsorption substrate 10 which is the microarray adsorption substrate 10 described above. A metal layer 30 is disposed on the microarray adsorption substrate 10. The metal layer 30 includes a semiconductor layer 31, wherein a plurality of heavily doped regions 32 are disposed on both sides of the semiconductor layer 31, and a gate dielectric layer 34 is disposed on the semiconductor layer 31 and the heavily doped regions 32. A gate metal layer 35 is disposed on the gate dielectric layer 34, wherein the semiconductor layer 31 is in contact with a source-drain metal layer 33.

The microarray adsorption substrate 10 is described in detail in the embodiments stated above. Therefore, the microarray adsorption substrate 10 is not over-described in the embodiment of the present disclosure.

Specifically, the metal layer 30 includes a first contact point 41, a second contact point 42, a third contact point 43, and a fourth contact point 44. When the display device is being charged, the first contact point 41 connects the positive potential, the third contact point 43 connects a positive point, and the second contact point 42 and the fourth contact point 44 connect the negative potential. When discharging the display device, the first contact point 41 and the fourth contact point 44 connect the positive potential. The second contact point 42 and the third contact point 43 connect the negative potential. The second contact point 42, the third contact point 43, and the fourth contact point 44 correspond to the first switch 1, the second switch 2, the third switch 3, and the fourth switch 4.

The structure of the embodiment of the present disclosure is employed. The electrostatic adsorption microarray structure 12 is charged by the circuit structure stated above, so that the temporary base 11 is adsorbed on the temporary substrate. After the processing is completed, the temporary base 11 is stripped off from the temporary substrate 4 by discharging the electrostatic adsorption microarray structure 12 of the embodiments of the present disclosure, thereby greatly reducing the damage to the temporary base 11 during stripping.

The microarray adsorption substrate, the driving circuit, and the display device provided by the embodiments of the present disclosure are described in detail as above. The principles and embodiments of the present disclosure are described in the specific examples. The description of the embodiments is only for helping understand the present disclosure. It should be understood by those skilled in the art that they can still modify the technical solutions described in the above embodiments or equivalently replace some of the technical features based on the idea of the present disclosure. Therefore, the contents of the present specification should not be regarded as the limitation of the present disclosure.

What is claimed is:

1. A driving circuit applied in a microarray adsorption substrate, wherein the microarray adsorption substrate comprises: a temporary base, an electrostatic adsorption microarray structure, and a protective film;
   the temporary base has a first surface and a second surface disposed opposite each other;
   an electrostatic adsorption microarray structure is disposed on the first surface and used to charge and discharge; and
   the protective film is disposed on a surface of the electrostatic adsorption microarray structure away from the temporary base, and embedded in a plurality of gaps of the electrostatic adsorption microarray structure;
   the driving circuit comprises: a power supply comprising a first end and a second end, wherein the first end has a first interface and a second interface, the first interface connects a first field-effect transistor, and the first field-effect transistor connects a second field-effect transistor and a third field-effect transistor respectively;
   the first field-effect transistor, the second field-effect transistor, and the third field-effect transistor connect the second end, the second interface connects a sixth field-effect transistor, and the sixth field-effect transistor connects a fifth field-effect transistor and a fourth field-effect transistor respectively; and
   a capacitance is connected between the third field-effect transistor and the fourth field-effect transistor, and the fourth field-effect transistor, the fifth field-effect transistor, and the sixth field-effect transistor connect the second end, wherein the first end connects a first switch and a fourth switch, and the second end connects a second switch and a third switch.

2. The driving circuit as claimed in claim 1, wherein when charging the driving circuit, the first switch connects the first field-effect transistor, the second field-effect transistor, and the third field-effect transistor, and the third switch connects the fourth field-effect transistor, the fifth field-effect transistor, and the sixth field-effect transistor;
   when discharging the driving circuit, the second switch connects the first field-effect transistor, the second field-effect transistor, and the third field-effect transistor, and the third switch connects the fourth field-effect transistor, the fifth field-effect transistor, and the sixth field-effect transistor.

3. The driving circuit as claimed in claim 1, wherein the first end is at a positive potential and the second end is at a negative potential.

4. The driving circuit as claimed in claim 1, wherein the electrostatic adsorption microarray structure comprises at least a set of a latch circuit and a capacitance circuit connected in series with the latch circuit, and the latch circuit is used to charge the capacitance circuit.

5. The driving circuit as claimed in claim 1, wherein the protective film is a polyimide film.

6. A display device, comprising a microarray adsorption substrate, wherein a metal layer is disposed on the microarray adsorption substrate, the metal layer comprises a semiconductor layer, a plurality of heavily doped regions are disposed on both sides of the semiconductor layer, a gate dielectric layer is disposed on the semiconductor layer, and a gate metal layer is disposed on the gate dielectric layer, wherein the semiconductor layer is in contact with a source-drain metal layer;

the microarray adsorption substrate comprises a temporary base, an electrostatic adsorption microarray structure, and a protective film; wherein the temporary base has a first surface and a second surface disposed opposite each other; the electrostatic adsorption microarray structure is disposed on the first surface, and used to charge and discharge; and the protective film is disposed on a surface of the electrostatic adsorption microarray structure away from the temporary base, and embedded in a plurality of gaps of the electrostatic adsorption microarray structure;

the display device further comprises a driving circuit, the driving circuit comprises: a power supply comprising a first end and a second end, wherein the first end has a first interface and a second interface, the first interface connects a first field-effect transistor, and the first field-effect transistor connects a second field-effect transistor and a third field-effect transistor respectively;

the first field-effect transistor, the second field-effect transistor, and the third field-effect transistor connect the second end, the second interface connects a sixth field-effect transistor, and the sixth field-effect transistor connects a fifth field-effect transistor and a fourth field-effect transistor respectively; and a capacitance is connected between the third field-effect transistor and the fourth field-effect transistor, and the fourth field-effect transistor, the fifth field-effect transistor, and the sixth field-effect transistor connect the second end, wherein the first end connects a first switch and a fourth switch, and the second end connects a second switch and a third switch.

7. The display device as claimed in claim 6, wherein the electrostatic adsorption microarray structure comprises at least a set of a latch circuit and a capacitance circuit connected in series with the latch circuit, and the latch circuit is used to charge the capacitance circuit.

8. The display device as claimed in claim 6, wherein the protective film is a polyimide film.

9. The display device as claimed in claim 8, wherein a thickness of the polyimide film is 10-1000 microns.

10. The display device as claimed in claim 7, wherein a width of each line of the capacitance circuit is 10-1000 microns.

11. The display device as claimed in claim 6, wherein the protective film is selected from any one of alumina film layers, silicon nitride, hafnium oxide, quartz, and polytetrafluoroethylene.

12. The display device as claimed in claim 6, wherein when charging the display device, the first switch connects the first field-effect transistor, the second field-effect transistor, and the third field-effect transistor, and the third switch connects the fourth field-effect transistor, the fifth field-effect transistor, and the sixth field-effect transistor;

when discharging the display device, the second switch connects the first field-effect transistor, the second field-effect transistor, and the third field-effect transistor, and the third switch connects the fourth field-effect transistor, the fifth field-effect transistor, and the sixth field-effect transistor.

13. The display device as claimed in claim 6, wherein the first end is at a positive potential and the second end is at a negative potential.

\* \* \* \* \*